United States Patent
Chen et al.

(10) Patent No.: US 11,892,873 B2
(45) Date of Patent: Feb. 6, 2024

(54) COMPUTER DEVICE

(71) Applicant: ASUSTEK COMPUTER INC., Taipei (TW)

(72) Inventors: Yung-Hsiang Chen, Taipei (TW); Li-Hsiang Chiu, Taipei (TW); Marco Da Ros, Taipei (TW); Li-Wei Hung, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/739,894

(22) Filed: May 9, 2022

(65) Prior Publication Data
US 2023/0050313 A1 Feb. 16, 2023

(30) Foreign Application Priority Data

Aug. 13, 2021 (TW) .................. 110129883

(51) Int. Cl.
*G06F 1/16* (2006.01)
*H05K 7/12* (2006.01)
*G06F 1/18* (2006.01)

(52) U.S. Cl.
CPC ............ *G06F 1/1601* (2013.01); *G06F 1/181* (2013.01); *H05K 7/12* (2013.01)

(58) Field of Classification Search
CPC ...... G06F 1/1601; G06F 1/181; G06F 1/1632; H05K 7/12
See application file for complete search history.

(56) References Cited

U.S. PATENT DOCUMENTS

| | | | | |
|---|---|---|---|---|
| 6,418,010 | B1 * | 7/2002 | Sawyer | F16M 11/14 361/801 |
| 8,366,060 | B2 * | 2/2013 | Hung | F16M 13/022 248/278.1 |
| 8,922,457 | B2 * | 12/2014 | Moscovitch | G06F 1/181 361/679.21 |
| 10,860,066 | B1 * | 12/2020 | Barnard | F16M 11/041 |
| 10,901,475 | B2 * | 1/2021 | Volek | H02J 7/0042 |
| 11,647,834 | B2 * | 5/2023 | Carral O Gorman | A47B 81/06 248/560 |
| 2008/0204621 | A1 * | 8/2008 | Chang | B60R 11/0235 349/58 |

(Continued)

FOREIGN PATENT DOCUMENTS

CN 104375567 A 2/2015
CN 204631714 U 9/2015
(Continued)

OTHER PUBLICATIONS

An Office Action dated Jun. 16, 2022 in TW Application No. 110129883 is attached, 5 pages.

*Primary Examiner* — Rockshana D Chowdhury
(74) *Attorney, Agent, or Firm* — Muncy, Geissler, Olds & Lowe, P.C.

(57) ABSTRACT

The disclosure provides a computer device. The computer device includes a base, a host case, and a display support. The base includes an upper surface and includes a power module therein. The host case is detachably fixed to the base and electrically connected to the power module through the upper surface. One end of the display support is connected to the base, and the other end thereof includes a display connection structure.

7 Claims, 7 Drawing Sheets

(56) References Cited

U.S. PATENT DOCUMENTS

| | | | |
|---|---|---|---|
| 2009/0079665 A1* | 3/2009 | Moscovitch | F16M 11/10 |
| | | | 345/1.3 |
| 2010/0188812 A1* | 7/2010 | Morrison | G06F 1/181 |
| | | | 248/274.1 |
| 2012/0162949 A1* | 6/2012 | Han | F16M 11/06 |
| | | | 361/803 |
| 2013/0314300 A1* | 11/2013 | Moscovitch | G06F 3/1431 |
| | | | 345/1.3 |
| 2015/0355687 A1* | 12/2015 | Chiang | G06F 1/189 |
| | | | 345/55 |
| 2021/0072792 A1* | 3/2021 | DeCamp | G06F 13/4022 |
| 2022/0075407 A1* | 3/2022 | Chen | G06F 1/182 |
| 2022/0308621 A1* | 9/2022 | Godfrey | G06F 1/20 |

FOREIGN PATENT DOCUMENTS

| | | | | |
|---|---|---|---|---|
| CN | 109960320 A | * | 7/2019 | |
| CN | 210014194 U | | 2/2020 | |
| CN | 210534649 U | | 5/2020 | |
| CN | 211669575 U | | 10/2020 | |
| CN | 112817408 A | * | 5/2021 | ........... G06F 1/1601 |
| TW | M-256515 U | | 2/2005 | |

\* cited by examiner

COMPUTER DEVICE

CROSS-REFERENCE TO RELATED APPLICATION

This application claims the priority benefit of Taiwan Application Serial No. 110129883, filed on Aug. 13, 2021. The entirety of the above-mentioned patent application is hereby incorporated by reference herein and made a part of the specification.

BACKGROUND OF THE INVENTION

Field of the Invention

The disclosure relates to a computer device, and in particularly, to a computer device used as a partition structure.

Description of the Related Art

A conventional computer device often occupies a large desktop area of a desk when being disposed in an office, resulting in a limitation on a workspace of a user and impact on the appearance of the office. On the other hand, although a conventional all-in-one computer device helps to alleviate the problem of limited desktop space, the expansion of the conventional all-in-one computer host is not easy.

BRIEF SUMMARY OF THE INVENTION

The disclosure provides a computer device. The computer device includes a base, a host case, and a display support. The base includes an upper surface and includes a power module therein. The host case is detachably fixed to the base and electrically connected to the power module through the upper surface. One end of the display support is connected to the base, and the other end thereof includes a display connection structure.

The computer device of the disclosure is directly used as a partition in an office to alleviate the problem of limited desktop space. In addition, another expansion module is further added to the base to resolve the problem of difficult expansion of a conventional all-in-one computer.

DETAILED DESCRIPTION OF THE EMBODIMENTS

More detailed descriptions of the specific embodiments of the disclosure are provided below with reference to the accompanying drawings. The advantages and features of the disclosure are described more clearly according to the following description and claims. It should be noted that all of the drawings use very simplified forms and imprecise proportions, only being used for assisting in conveniently and clearly explaining the objective of the embodiments of the disclosure.

Figure 1:
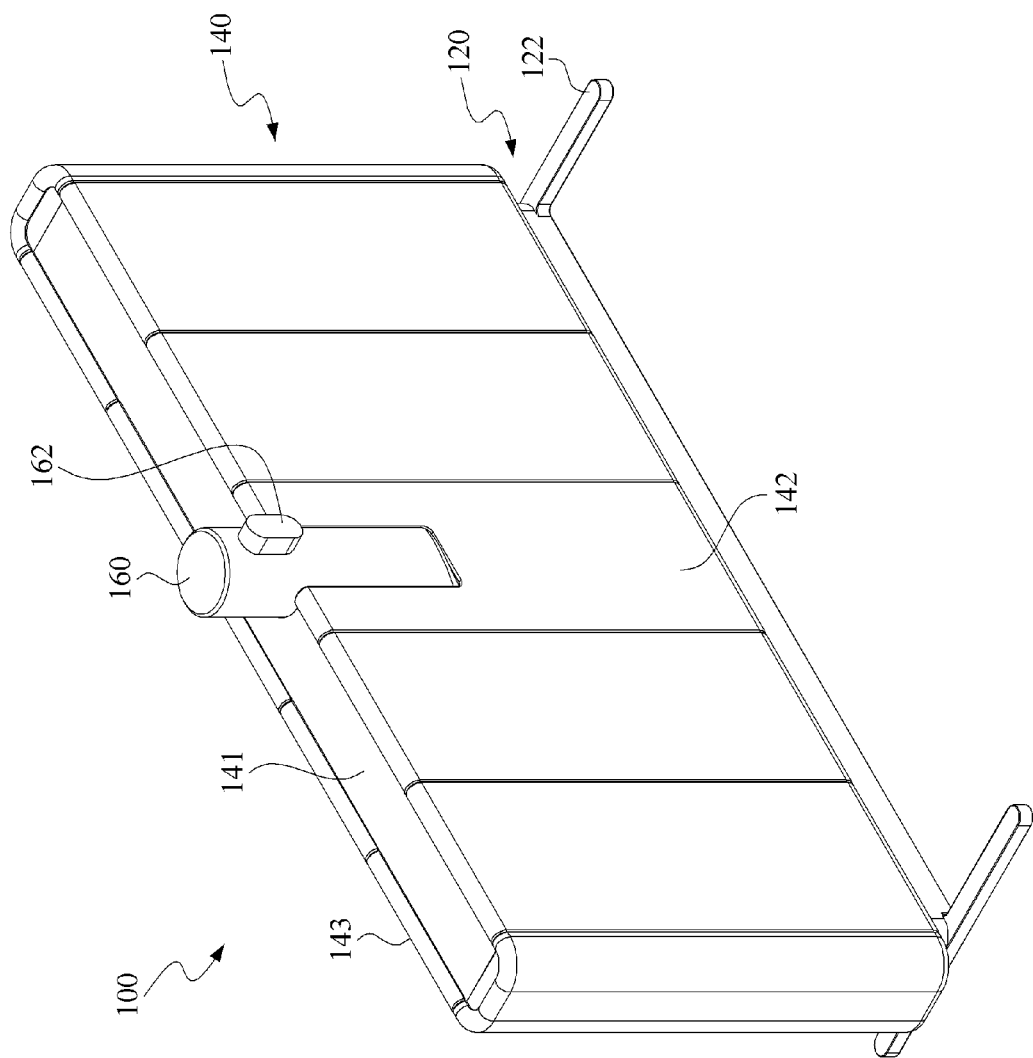
FIG. 1 is a schematic three-dimensional view of a first embodiment of a computer device according to the disclosure.
Figure 2:
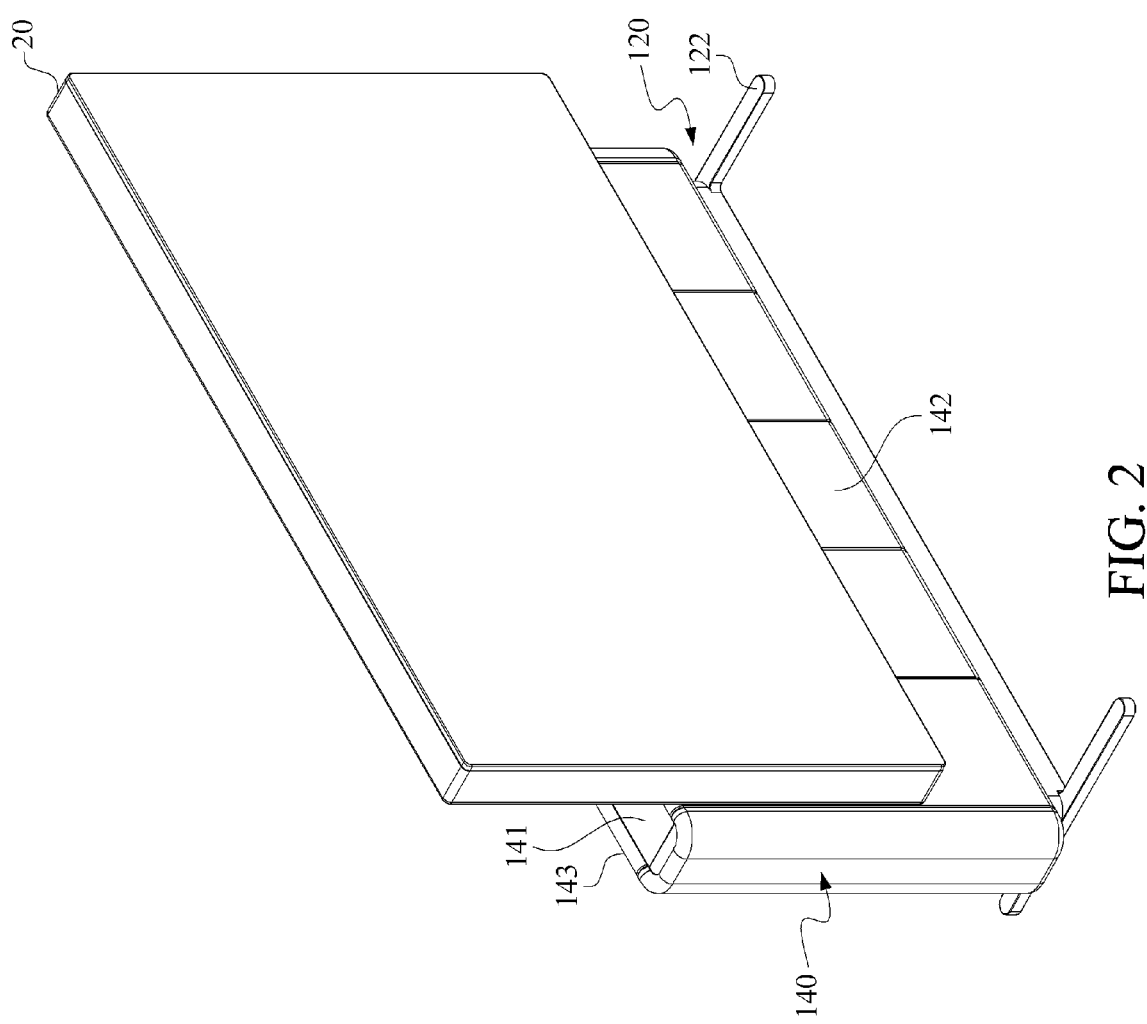
FIG. 2 is a schematic three-dimensional view of the computer device in FIG. 1 with a display installed for use.
Figure 3:
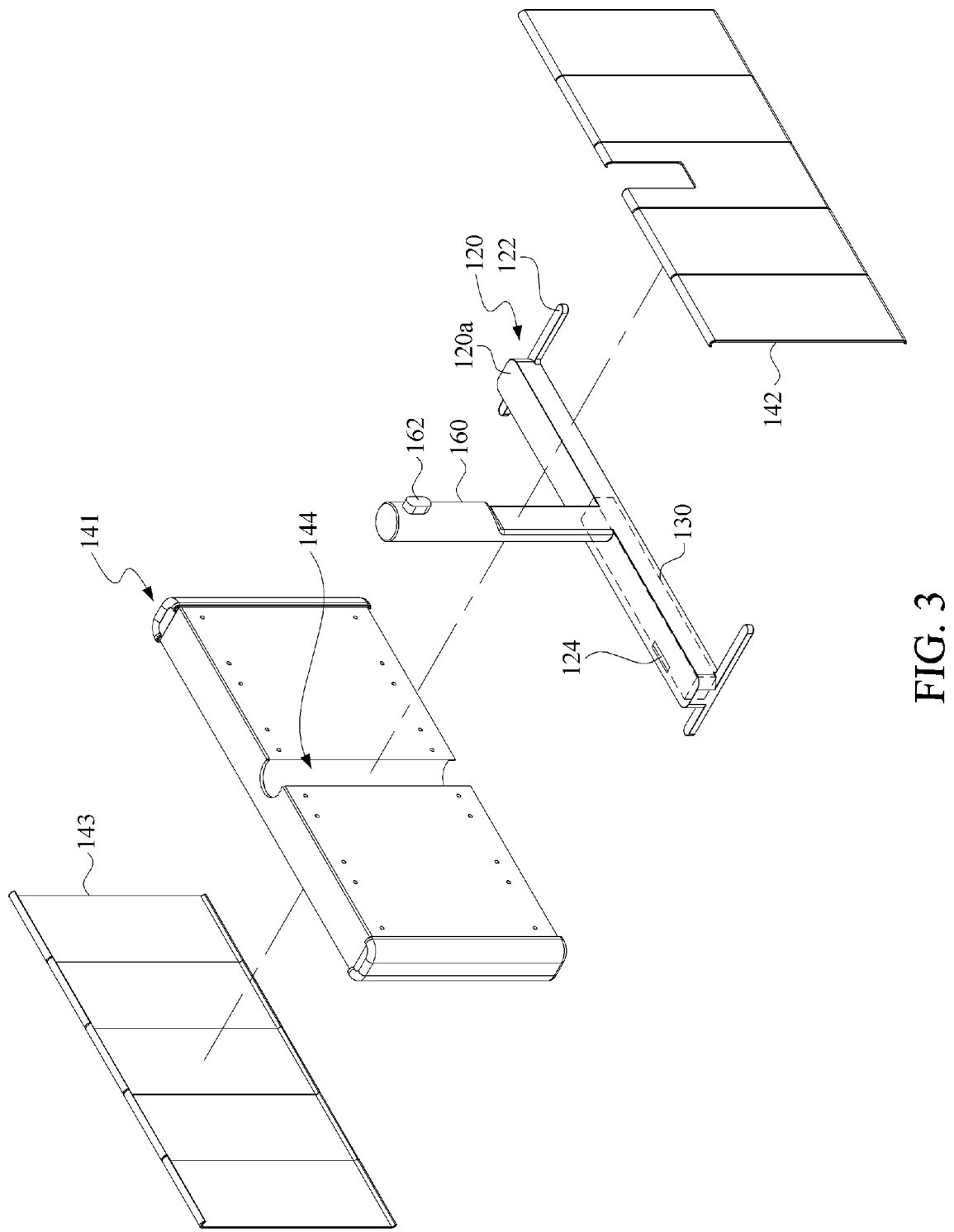
FIG. 3 is a schematic exploded view of the computer device in FIG. 1.

FIG. 1 is a schematic three-dimensional view of a first embodiment of a computer device according to the disclosure. FIG. 2 is a schematic three-dimensional view of the computer device in FIG. 1 with a display installed for use. FIG. 3 is a schematic exploded view of the computer device in FIG. 1.

As shown in FIG. 1 and FIG. 2, the computer device 100 includes a base 120, a host case 140, and a display support 160.

The base 120 includes an upper surface 120a and includes a power module 130 therein (indicated by dashed lines). The power module 130 is configured to provide electric energy required for operation of the computer device. In an embodiment, the power module 130 also supplies power to a display 20 through the display support 160. In an embodiment, the base 120 includes a stand 122 at the bottom thereof. The stand 122 is configured to firmly mount the display support 160 and the host case 140 on a desk.

Also referring to FIG. 3, the host case 140 is detachably fixed to the base 120, and is electrically connected to the power module 130 inside the base 120 through the upper surface 120a of the base 120. In an embodiment, as shown in the figure, the upper surface 120a of the base 120 includes a connection portion 124, and the host case 140 is detachably fixed to the base 120 through the connection portion 124.

In an embodiment, the connection portion 124 also has the function of supplying power to the host case 140. In an embodiment, a power socket is disposed on the connection portion 124, and a power plug is disposed at a corresponding position on a lower surface of the host case 140. Alternatively, the power plug is disposed on the connection portion 124, and the power socket is disposed at the corresponding position on the lower surface of the host case 140. In this way, the host case 140 obtains power from the base 120 through the connection portion 124.

One end of the display support 160 is connected to the base 120, and the display support 160 extends upward from the upper surface 120a of the base 120 to the height required for installing the display 20. The other end of the display support 160 (the end away from the base 120) includes a display connection structure 162, configured to connect the display 20. In an embodiment, the display support 160 and the base 120 are integrally formed. However, the disclosure is not limited thereto. In another embodiment, the display support 160 is detachably fixed to the base 120. A user chooses different display supports 160 according to needs. In an embodiment, the user chooses different display supports according to the number and types of displays that need to be installed.

In an embodiment, the display connection structure 162 also has the functions of supplying power and transmitting signals. Furthermore, a power connector and a signal connector are disposed on the display connection structure 162. The power connector is connected to the power module 130 of the base 120 to obtain electric energy, and the signal connector is connected to a motherboard inside the host case 140 by the base 120 to obtain display signals. In an embodiment, the power connector is a general alternating current power plug, and the signal connector is a high-definition multimedia interface (HDMI) connector. When the display connection structure 162 is connected to the display 20, the display 20 obtains power through the power connector, and obtains display signals through the signal connector.

Referring to FIG. 3, the host case 140 includes a body 141, a front cover plate 142, and a rear cover plate 143. The front cover plate 142 and the rear cover plate 143 are detachably fixed to the front and the back of the body 141 by means of engagement or locking. The front cover plate 142 and the rear cover plate 143 decorate the appearance of the host case 140. According to actual requirements, in an embodiment, the to-be-presented appearance, a user only needs to select a different front cover plate 142 and a different rear cover plate 143 instead of replacing the entire host case 140.

In accordance with the disposition of the display support 160, the center of the body 141 of the host case 140 includes a vertical groove 144. The display support 160 is embedded in the groove 144. In an embodiment, the groove 144 is located at a position on the front of the body 141 corresponding to the front cover plate 142, that is, a surface of the host case 140 facing the user. Through the combination of the front cover plate 142 and the body 141, the display support 160 is firmly fixed in the groove 144.

The structural cooperation between the display support 160 and the groove 144 not only helps locate the host case 140 on the base 120, but also prevents the display support 160 from swaying left and right, making the display support 160 more stable.

In the foregoing embodiment, the center of the body 141 includes a vertical groove 144 to hold the display support 160. To maintain the integrity of the internal space of the host case 140 and prevent the internal space of the body 141 from being separated by the vertical groove 144. In other embodiments, the display support 160 is provided behind the host case 140. In other words, the display support 160 extends upward from the base 120 along the rear side of the host case 140, and then extends forward above the host case 140 to connect to the display 20.

Figure 4:
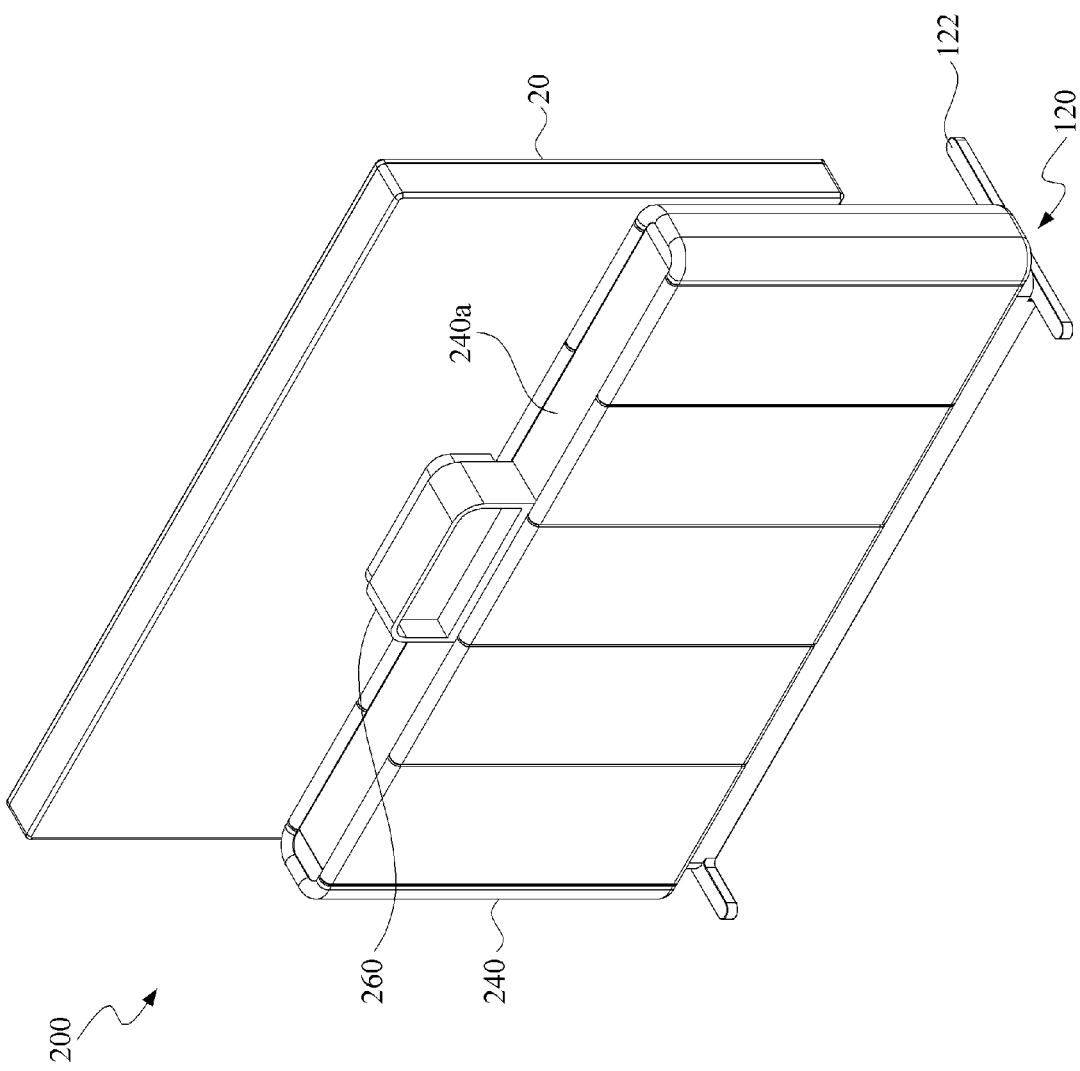
FIG. 4 is a schematic three-dimensional view of a second embodiment of a computer device according to the disclosure.

FIG. 4 is a schematic three-dimensional view of a second embodiment of a computer device 200 according to the disclosure. This embodiment mainly differs from the embodiment of FIG. 1 in respect of a difference in the display support 160.

Compared with that the display support 160 in the embodiment of FIG. 1 is detachably fixed to the base 120, and the center of the body 141 of the host case 140 includes the vertical groove 144 to hold the display support 160, a display support 260 of this embodiment is fixed to an upper edge 240a of a host case 240, and is fixed to the base 120 through the host case 240. The display support 260 directly obtains display signals from a motherboard inside the host case 240, and obtains power from the base 120 through the host case 240. In this way, the structure of the display support 260 is simplified, which helps to maintain the integrity of the internal space of the host case 240.

Figure 5:
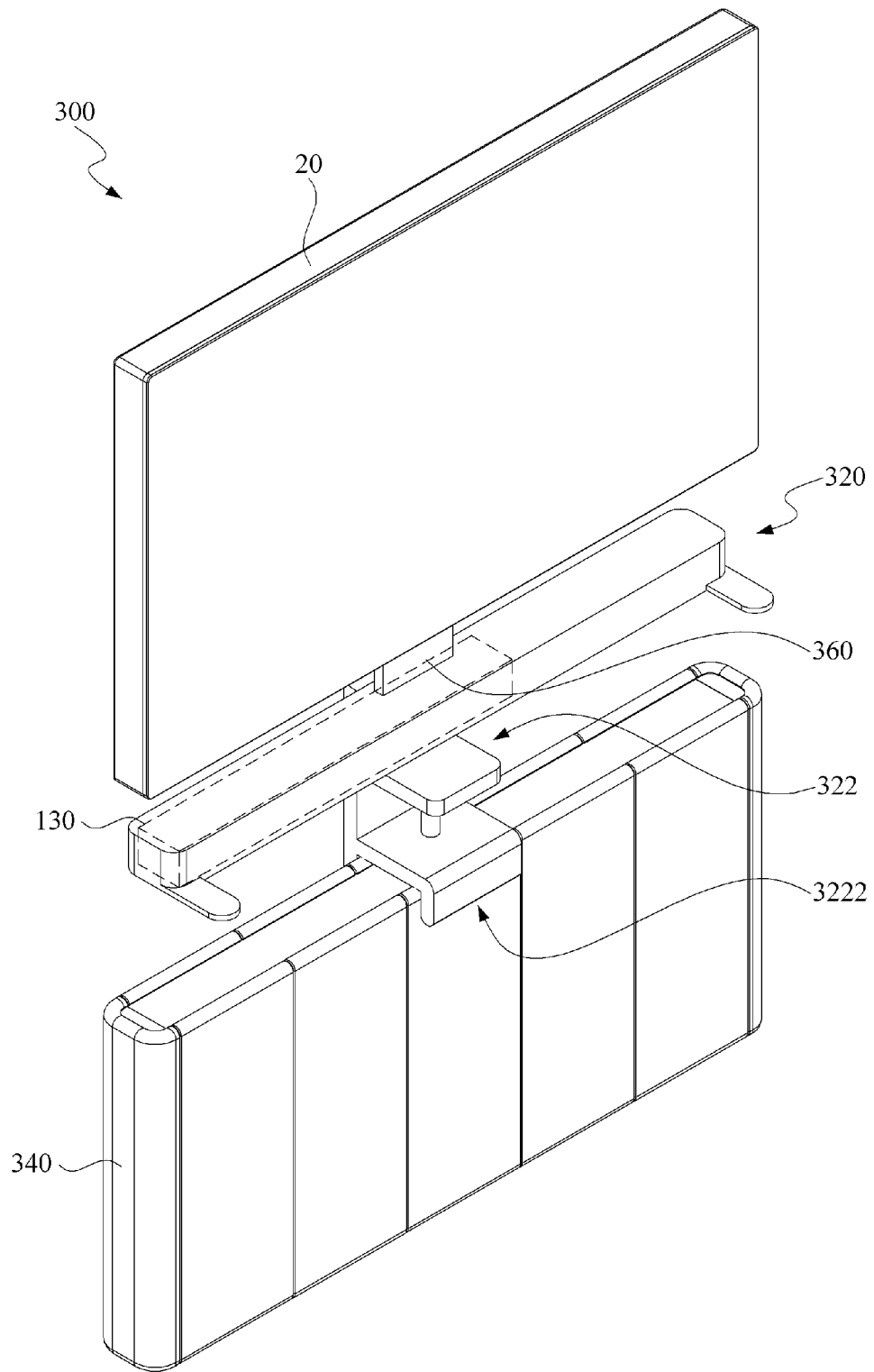
FIG. 5 is a schematic three-dimensional view of a third embodiment of a computer device according to the disclosure.
Figure 6:
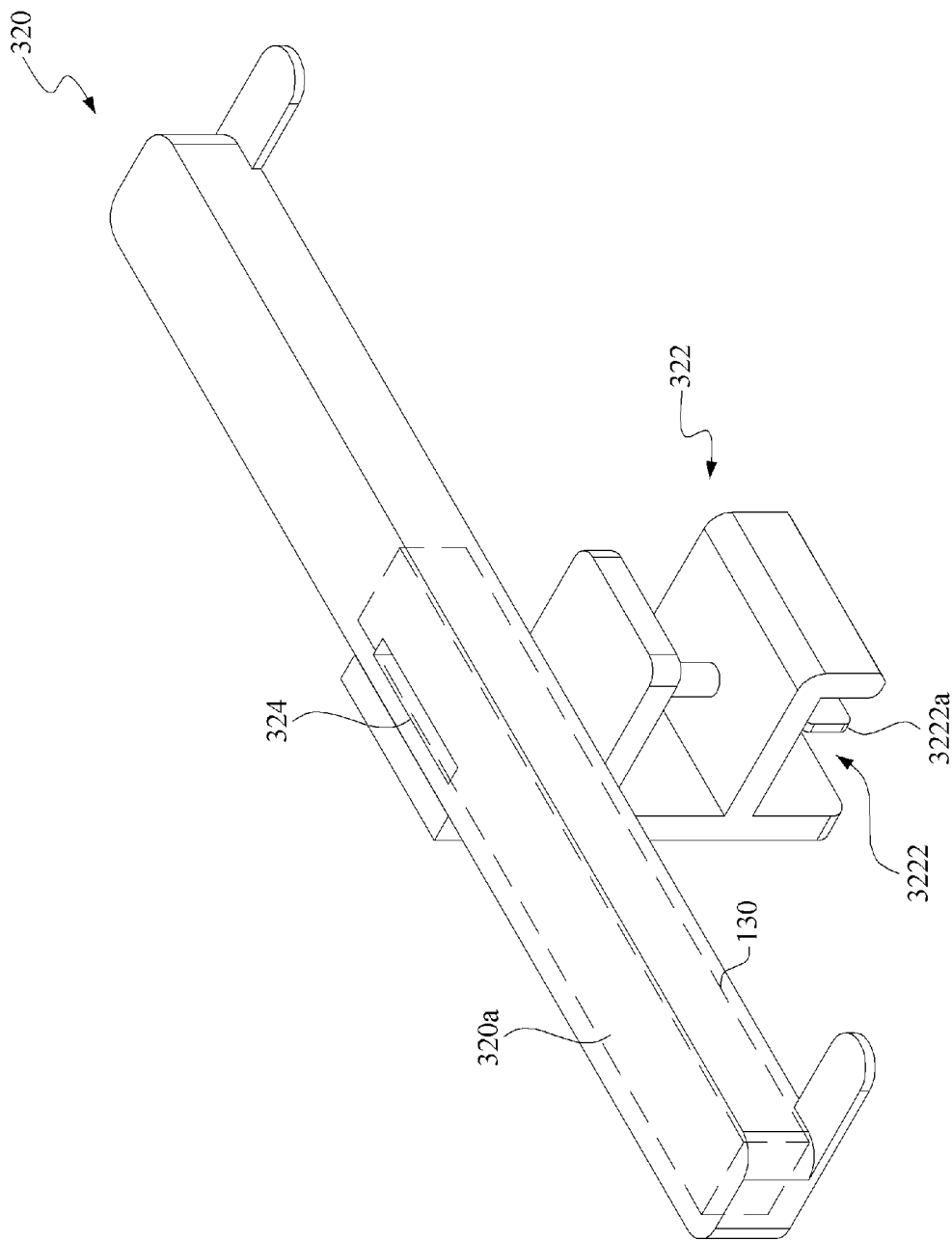
FIG. 6 is a schematic three-dimensional view of a base in FIG. 5.

FIG. 5 is a schematic three-dimensional view of a third embodiment of a computer device according to the disclosure. FIG. 6 is a schematic three-dimensional view of a base in FIG. 5. This embodiment mainly differs from the embodiment of FIG. 1 in respect of a difference between bases 120 and 320 and a difference between display supports 160 and 360.

As shown in the figure, a computer device 300 in this embodiment includes a base 320, a host case 340, and a display support 360.

The computer device 300 of this embodiment further includes a clamp 322. The clamp 322 is disposed under the base 320 and configured to fix the base 320 to the desk. The base 320 includes a connection portion 324. The connection portion 324 is located on an upper surface 320a of the base 320. In an embodiment, the clamp 322 extends downward from the rear side of the base 320, to help to be disposed on the desk in a clamping manner.

The clamp 322 includes a fixing structure 3222. The host case 340 is detachably disposed under the base 320 through the fixing structure 3222. The fixing structure 3222 further includes a connector 3222a. The connector 3222a is electrically connected to the power module 130 in the base 320 to provide electric energy required for operation of the host case 340. Through the arrangement of the clamp 322 and the fixing structure 3222, the host case 340 of the computer device of this embodiment is mounted under the desk, to resolve the problem of limited desktop space in an office.

Different from the embodiment of FIG. 1, the display support 160 and the base 120 are integrally formed. The display support 360 in this embodiment is detachably fixed to the connection portion 324 of the base 320. In an embodiment, the connection portion 324 has the functions of supplying power and transmitting signals. In other words, the power module 130 in the base 320 supplies power to the display support 360 through the connection portion 324. The host case 340 transmits display signals to the connection portion 324 through the wiring in the clamp 322, and then transmits the display signals to the display support through the connection portion 324. The display 20 obtains power supply and display signals through the display support 360. This helps simplify connection lines and makes the appearance of the computer device more concise.

The length of the base 120 of the computer devices 100 and 200 in the first embodiment and the second embodiment of the disclosure roughly corresponds to the length of the host case 140. However, the disclosure is not limited thereto.

Figure 7:
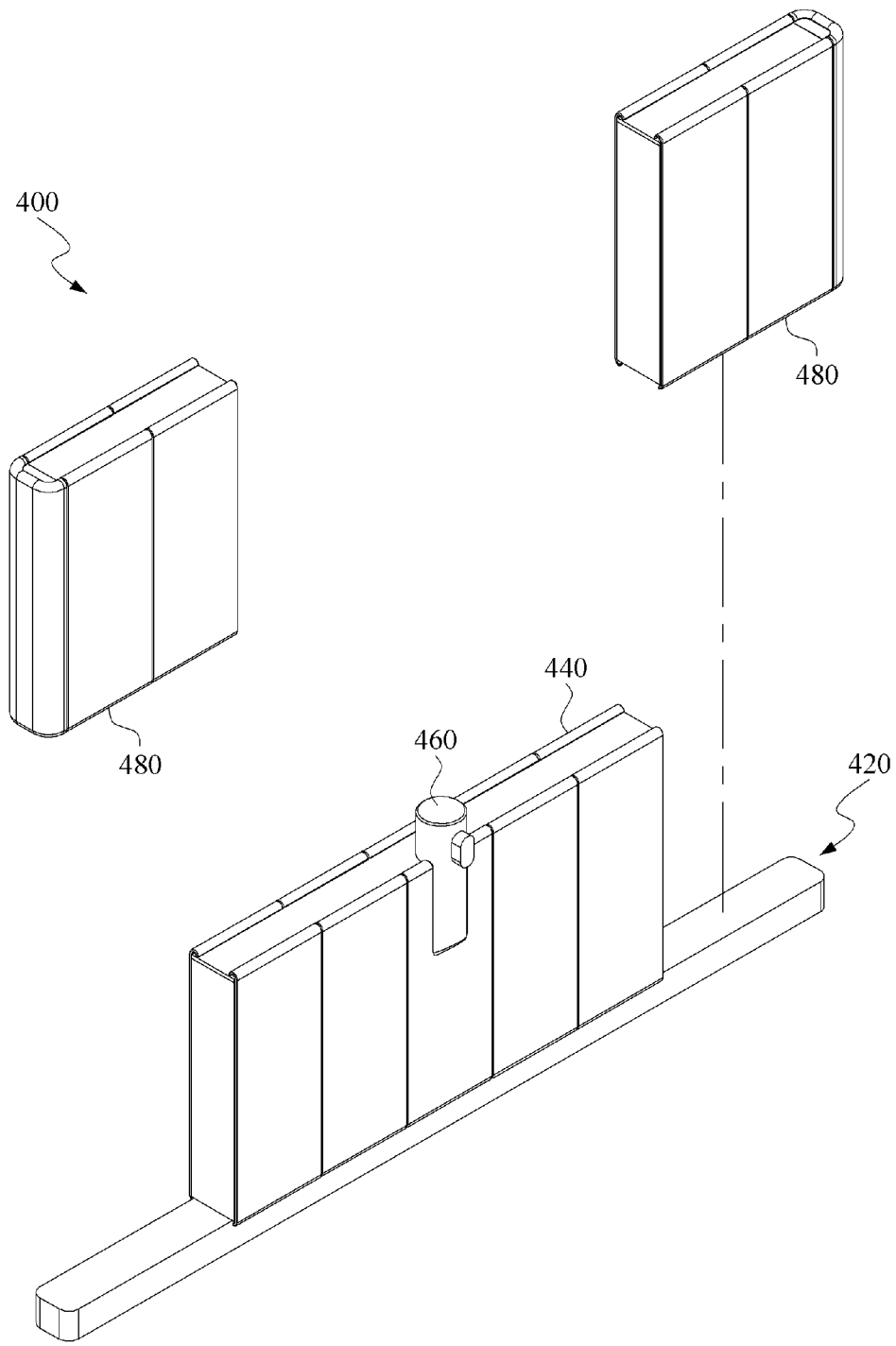
FIG. 7 is a schematic three-dimensional view of a fourth embodiment of a computer device according to the disclosure.

FIG. 7 is a schematic three-dimensional view of a fourth embodiment of a computer device according to the disclosure. In the embodiment of FIG. 7, the length of a base 420 of a computer device 400 is greater than the length of a host case 440. The host case 440 is disposed at the center of the base 420. A display support 460 is further disposed on the base 420 to connect to the display. Expansion modules 480 are disposed on a side of the host case 440 to expand functions of the computer device 400. The expansion modules 480 are detachably fixed to the base 420 and obtain power through the base 420. The expansion modules 480 include a light effect module, a speaker module, a graphics processing unit (GPU) module, a storage module and the like.

In the embodiment of FIG. 7, the host case 440 is installed at the center of the base 420, and the expansion modules 480 are installed on both sides of the host case 440. However, the disclosure is not limited thereto. An installation position of the host case 440 is adjusted according to actual needs. In another embodiments, the host case 440 is alternatively installed on one side of the base 420. An expansion module 480, or even another host case 440, is installed on the other side of the base 420. When two host cases 440 are installed, the two host cases 440 share the power supplied by the base

420. The base 420 adjusts power supplied to the two host cases 440 according to operating statuses of computer systems in the two host cases 440. In an embodiment, the base adjusts maximum power supply values for the two host cases 440 according to real-time power consumption of the two host cases 440.

The computer devices 100, 200, 300, and 400 of the disclosure effectively alleviate the problem of limited desktop space. In some embodiments, through a specially designed base, the host case 340 of the computer device 300 of the disclosure is moved to under the desk to increase the available space on the desktop. In addition, in some embodiments, another expansion module 480 is alternatively added to the base 420 to resolve the problem of difficult expansion of a conventional all-in-one computer.

The above are merely preferred embodiments of the disclosure, and do not constitute any limitation on the disclosure. The disclosure can be implemented in any suitable form. Any form of equivalent replacements or modifications to the technical means and technical content disclosed in the disclosure made by a person skilled in the art without departing from the scope of the technical means of the disclosure still fall within the content of the technical means of the disclosure and the protection scope of the disclosure.

What is claimed is:

1. A computer device, comprising:
    a base, comprising an upper surface and comprising a power module therein;
    a host case, detachably fixed to the base and electrically connected to the power module through the upper surface;
    a display support, comprising one end connected to the base and the other end comprising a display connection structure; and
    a clamp, being disposed under the base,
    wherein the clamp is configured to fix the base to a desk and comprises a fixing structure, configured to fix the host case under the desk,
    the host case comprises a body and a front cover,
    the body comprises a groove, and the display support is embedded in the groove, and
    the groove is located at a position of the body corresponding to the front cover plate, and the combination of the front cover plate and the body has the display support fixed in the groove.

2. The computer device according to claim 1, wherein the display support is detachably connected to the base.

3. The computer device according to claim 1, wherein the fixing structure comprises a connector, and the connector is electrically connected to the power module.

4. The computer device according to claim 1, wherein the upper surface comprises a connection portion, and the host case is detachably fixed to the base through the connection portion.

5. The computer device according to claim 4, wherein the connection portion comprises a power socket.

6. The computer device according to claim 1, wherein the display connection structure comprises a power connector and a signal connector, the power connector is electrically connected to the power module, and the signal connector is electrically connected to the host case through the base.

7. The computer device according to claim 1, wherein a length of the base is greater than a length of the host case.

\* \* \* \* \*